United States Patent
Assefa et al.

(10) Patent No.: US 7,505,308 B1
(45) Date of Patent: Mar. 17, 2009

(54) SYSTEMS INVOLVING SPIN-TRANSFER MAGNETIC RANDOM ACCESS MEMORY

(75) Inventors: Solomon Assefa, Ossining, NY (US); William J. Gallagher, Ardsley, NY (US); Chung H. Lam, Peekskill, NY (US); Jonathan Z. Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/118,441

(22) Filed: May 9, 2008

(51) Int. Cl.
  *G11C 11/14* (2006.01)
  *G11C 11/15* (2006.01)
  *G11C 11/16* (2006.01)

(52) U.S. Cl. .................. 365/158; 365/171; 365/173; 365/225.5; 257/414; 257/421

(58) Field of Classification Search .............. 365/158, 365/171, 173, 243.5, 225.5, 51, 230.07; 257/414, 257/421; 360/324, 324.1, 314, 316
See application file for complete search history.

(56) References Cited

U.S. PATENT DOCUMENTS

| 7,110,284 | B2 | 9/2006 | Hayakawa et al. |
| 2006/0227466 | A1* | 10/2006 | Yagami ............... 360/324.2 |
| 2007/0195594 | A1* | 8/2007 | Koga ..................... 365/171 |
| 2007/0279973 | A1* | 12/2007 | Oikawa ................. 365/158 |

* cited by examiner

Primary Examiner—J. H. Hur
(74) Attorney, Agent, or Firm—Cantor Colburn LLP; Vazken Alexanian

(57) ABSTRACT

An exemplary magnetic random access memory system comprising, a spin-current generating portion including, a ferromagnetic film layer, and a conductance layer, a first write portion in electrical contact with the ferromagnetic film including, a selection device, and a first read portion in electrical contact with the conductance layer including, a free layer magnet, a read non-magnetic layer, and a reference layer, a second write portion in electrical contact with the ferromagnetic film, and a second read portion in electrical contact with the conductance layer.

2 Claims, 6 Drawing Sheets

SYSTEMS INVOLVING SPIN-TRANSFER MAGNETIC RANDOM ACCESS MEMORY

CROSS REFERENCE TO RELATED APPLICATIONS

The present application is co-pending with the concurrently filed applications, entitled "METHODS INVOLVING RESETTING SPIN-TORQUE MAGNETIC RANDOM ACCESS MEMORY," and "METHODS INVOLVING RESETTING SPIN-TORQUE MAGNETIC RANDOM ACCESS MEMORY WITH DOMAIN WALL" assigned to the assignee of the present application, the contents of which are incorporated herein by reference in their entirety.

BACKGROUND OF THE INVENTION

1. Field of the Invention

This invention relates generally to magnetic random access memory and specifically to spin-torque based magnetic random access memory.

2. Description of Background

When memory element sizes are reduced in semiconductor circuits, spin-torque based magnetic write random access memory systems become a desirable method for incorporating random access memory (RAM). The functionality of a two-terminal spin-torque switched memory element is determined by controlling three parameter distributions, namely the distribution of a junction breakdown voltage, the distribution of a write threshold voltage (or current), and the distribution of allowed read-error at any given read-voltage. The constraints of a relatively low break-down voltage in tunneling type devices, in combination with the relatively high current density (about $10^6$ A/cm$^2$) used at present for spin switching makes practical implementation of the technology challenging.

A common implementation of a two-terminal spin-torque memory involves 1-transistor and 1-magnetic tunnel junction called 1T-1MTJ architecture. In terms of cell size, a 1T-1MTJ architecture is relatively expensive. A denser architecture would make spin-RAM more competitive in terms of its cost/performance characteristics.

A dense, diode-selection based memory architecture has recently been demonstrated for a two-terminal memory device based on phase change materials. However, since spin-RAM usually uses bidirectional current for writing the 0 and 1 states, a dense, diode selection-based memory architecture is difficult to implement with spin-RAM.

SUMMARY OF THE INVENTION

The shortcomings of the prior art are overcome and additional advantages are achieved through an exemplary magnetic random access memory system comprising, a spin-current generating portion including, a ferromagnetic film layer, and a conductance layer, a first write portion in electrical contact with the ferromagnetic film including, a selection device, and a first read portion in electrical contact with the conductance layer including, a free layer magnet, a read non-magnetic layer, and a reference layer, a second write portion in electrical contact with the ferromagnetic film, and a second read portion in electrical contact with the conductance layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Systems involving spin-torque based magnetic write random access memory are provided. Several exemplary embodiments are described.

The embodiments of a spin-torque based magnetic write random access memory allow for more robust operation of the memory device with existing materials combination. It further enables the implementation of a high-density version of spin-RAM, based on diode-selection that makes spin-RAM more economical to produce. This improves cost-to-performance characteristics, while retaining the basic advantages of a spin-torque-based RAM. Embodiments include a ferromagnetic film layer with a magnetic direction that may be easily reversed at low field. The ferromagnetic film layer may be a source for changing a direction of spin injection using a unipolar write current for each bit. The ferromagnetic film layer may be relatively large (in excess of 100 nm) and shared by multiple memory bits.

Figure 1:
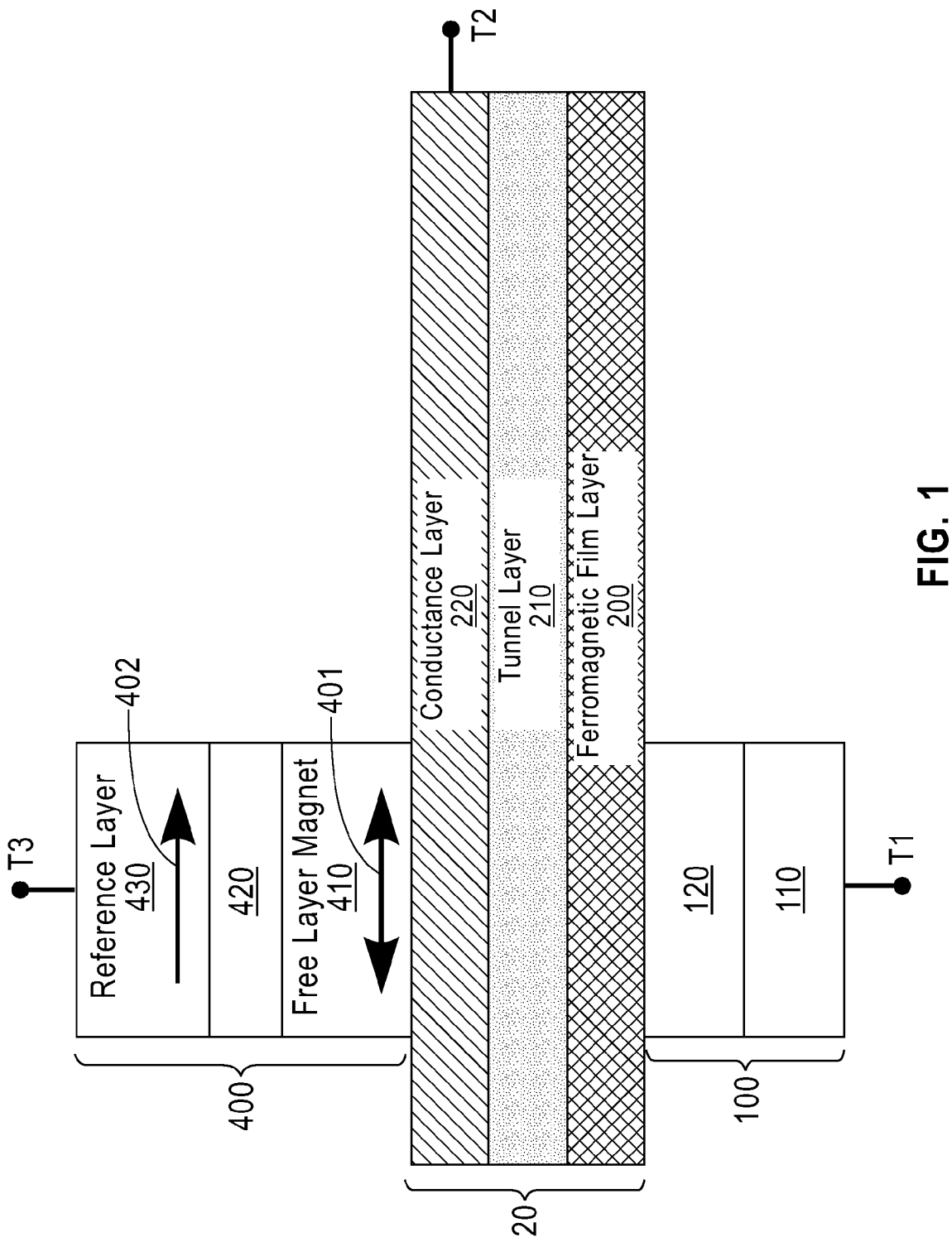
FIG. 1 illustrates a side-view of an exemplary embodiment of a spin-torque based magnetic write random access memory system.

FIG. 1 illustrates a three-terminal spin-torque based magnetic write random access memory containing three electrical connections, T1, T2 and T3 terminals. In the illustrated embodiment, a write portion 100 is a pillar-shaped non-linear selection device such as, for example, a P/N junction that includes a p-type doped region 110 and an n-type doped region 120 (or in reverse order, depending on the direction of write current for the design). The n-type doped region 120 electrically contacts a ferromagnetic film layer 200. The p-type doped region 110 electrically contacts the T1 terminal. Though the illustrated embodiment shows a P/N junction, any suitable non-linear selection device may be used for the write portion 100.

A spin-current generating portion 20 includes the ferromagnetic film layer 200, a tunnel barrier layer 210, and a conductance layer 220. The ferromagnetic film layer 200 is a magnetic, spin-polarizing layer. The conductance layer 220 is a non-magnetic, spin preserving, high conductance layer such as, for example, copper. The tunnel barrier layer 210 is a tunnel barrier separating the ferromagnetic film layer 200 and the conductance layer 220. Depending on the specifics of materials properties, the tunnel barrier layer 210 may not be necessary. In some materials combinations, it is possible to allow a direct, high quality interface (usually formed during thin film deposition) between the ferromagnetic film layer 200 and the conductance layer 220. The conductance layer 220 electrically contacts the T2 terminal.

A read portion 400 forms the magnetic memory and state detection device group. The read portion 400 is a pillar shape on the conductance layer 220. The read portion 400 includes a free layer magnet 410 disposed on the conductance layer 220, a read non-magnetic layer 420, and a reference layer 430. The read non-magnetic layer 420 is a non-magnetic spin-preserving metallic separation layer that may be for example, a tunnel barrier layer. The reference layer 430 electrically contacts the T3 terminal. The read portion 400 is disposed on the conductance layer 220 with a high quality interface, usually formed during film growth, to allow efficient interaction between the free layer magnet 410 and a spin-current (not shown).

The reference layer 430 is magnetically fixed. A direction of magnetization of the reference layer 430 is permanently fixed in the direction indicated by the arrow 402. In the illustrated embodiment, the arrow 402 points to the right, however, the arrow 402 may point to the left in other embodiments. The free layer magnet 410 is a nanomagnet having a magnetic state illustrated by the arrow 401. The free layer magnet 410 serves as a memory element and the direction of the arrow 401 (right or left) indicates two bi-stable memory states of the free layer magnet 410.

Figure 2:
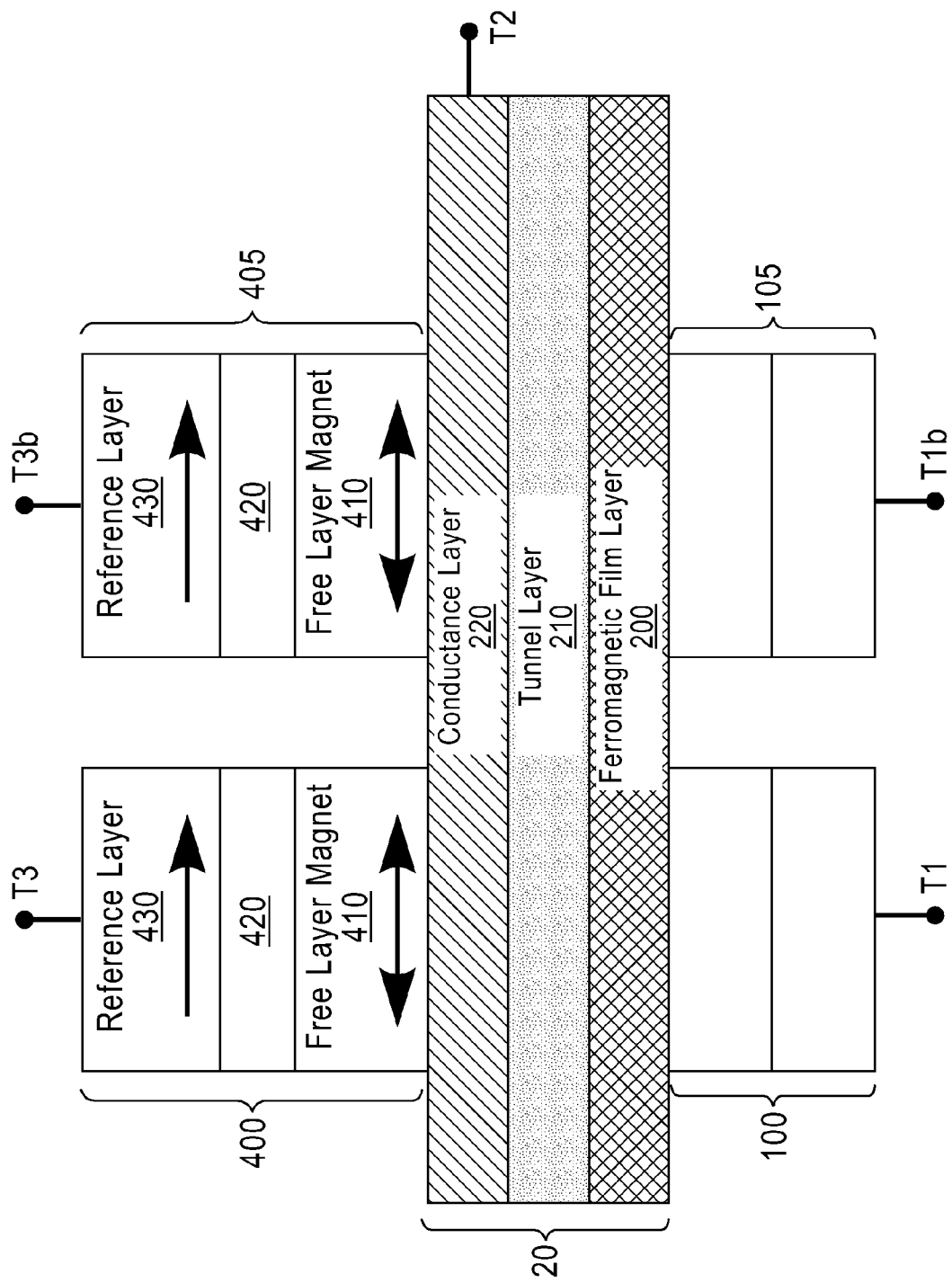
FIG. 2 illustrates a side-view of an alternate exemplary embodiment of a spin-torque based magnetic write random access memory system.

FIG. 2 illustrates an alternate exemplary embodiment of a spin-torque-based RAM. The embodiment illustrated in FIG. 2 is similar to FIG. 1, and includes an additional write portion 105 similar to the write portion 100 in electrical contact with terminal T1b and read portion 405 similar to the read portion 400 in electrical contact with terminal T3b. The write portion 105 and read portion 405 contact the spin-current generating portion 20. Though FIG. 2 illustrates two read portions 400 and 405 and two write portions 100 and 105, any number of additional read and write portions similar to the read portion 400 and write portion 100 may be included in other embodiments.

Figure 3:
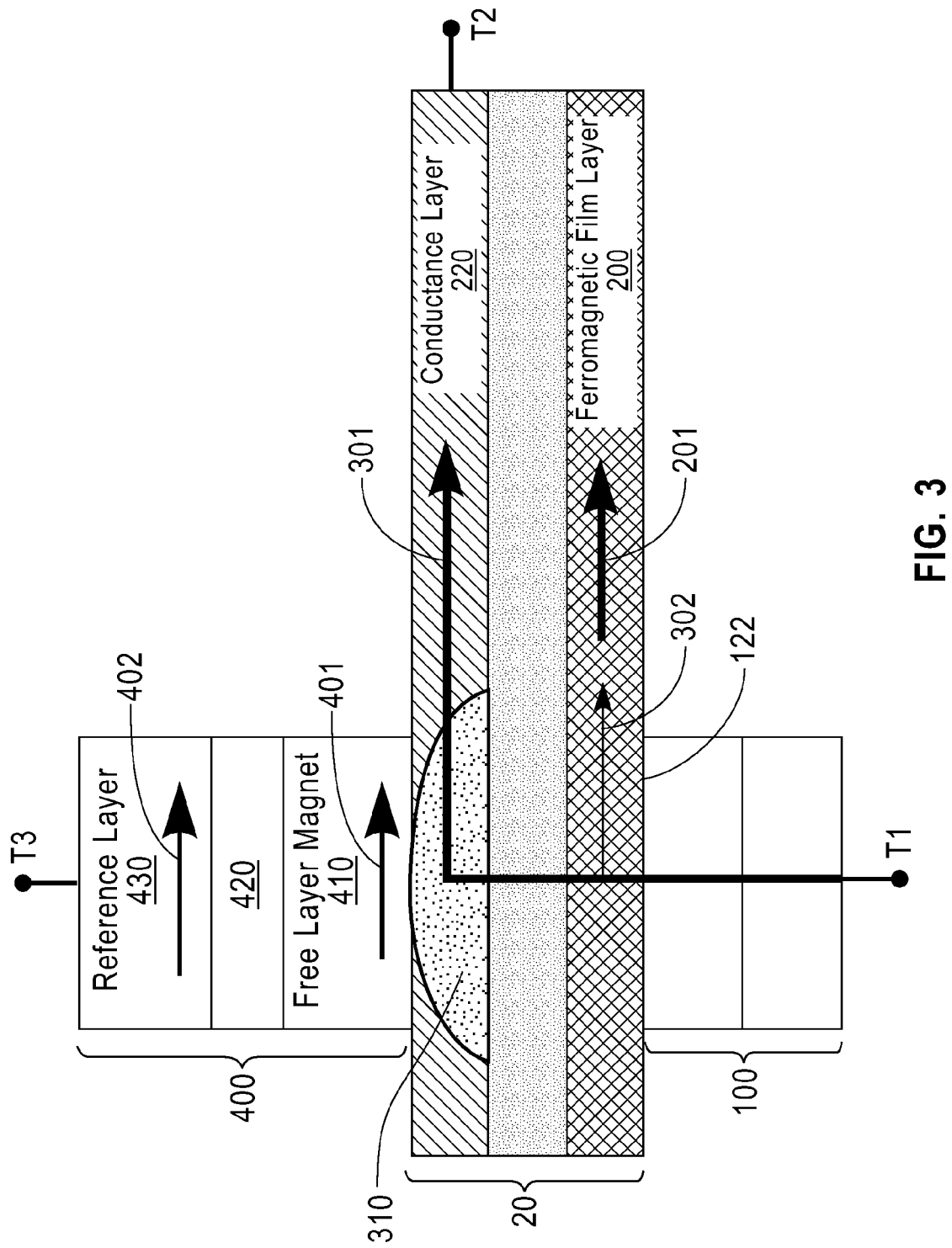
FIG. 3 illustrates a side-view of another alternate exemplary embodiment of a spin-torque based magnetic write random access memory system.

FIG. 3 illustrates a write operation of the exemplary embodiment of a spin-torque-based RAM shown in FIG. 1. The ferromagnetic film layer 200 has a magnetic direction as indicated by an arrow 201. The magnetization of the reference layer 430 is permanently fixed in the direction indicated by the arrow 402. A current 301 is injected from the terminal T1 through the conductance layer 220 to the terminal T2 that acts as a source drain terminal. The injection of the current 301 results in a spin accumulation. A spin accumulation is a non-equilibrium spin state with conduction electrons having a significant amount of excess spin in the direction defined by the magnetic orientation of the ferromagnetic film layer 200 and the direction of the current 301. The region having a spin accumulation is illustrated as region 310. The transport of electric current across interfaces defined by the write portion 100 and the ferromagnetic film layer 200 generates spin-current and a resulting spin accumulation. The spin-current and the spin accumulation may result in a change in the direction 401 of the magnetic state of the free layer magnet 410 with respect to the arrow 402.

The change in the direction of the magnetic state of the free layer magnet 410 with respect to 402 results in a change in a magnetoresistance of the read portion 400. The change in the magnetoresistance of the read portion 400 results in a change in resistance between terminals T2 and T3 that may be electrically measured. The measured change in resistance between terminals T2 and T3 is used to determine the magnetic state of the memory element, free layer magnet 410.

The materials and the thicknesses of layers 200, 210, and 220 should be selected such that when the current 301 is injected from terminal T1, the majority of the current 301 will pass through layer 220 and is drained into terminal T2. Only a small fraction of the current 301 (shown as current 302) should pass through the ferromagnetic film layer 200.

A current injection area 122 defined by the write portion 100 along ferromagnetic film layer 200 should have a lateral dimension such that the injected current 301 will be highly concentrated where the write portion 100 contacts the ferromagnetic film layer 200. The current injection area 122 should allow the injected current 301 to locally create a current density passing through the ferromagnetic film layer 200 and into the conductance layer 220 that results in a significant amount of spin current in region 310.

The structure of the illustrated embodiments separates the high current density spin-current injection process between terminals T1 and T2 (the write process), and the low bias current magnetic detection process of the magnetic state of the free layer magnet 410 via a magnetoresistance measurement between T2 and T3 (the read process). Thus, it allows separate optimization for the spin-current injection design of the system and the tunnel magnetoresistance detection device design of the system.

The illustrated embodiments allow unipolar current to be used for writing the magnetic direction for the memory element, free layer magnet 410. Once diode polarity for the memory architecture is determined, high current density via diode selection can only be delivered in one direction. In the structure of the illustrated embodiments, the ferromagnetic film layer 200 may be significantly larger than the free layer magnet 410. Thus, the magnetic direction of the ferromagnetic film layer 200 (arrow 201) may switch under an externally supplied magnetic field. The ferromagnetic film layer 200 can be shared by many read portions 400 and write portions 100, enabling high density packing of RAM. Control of the magnetic direction of the ferromagnetic film layer 200 via an external field is used as a means to allow unidirectional current to block-erase a group of memory elements.

Figure 4:
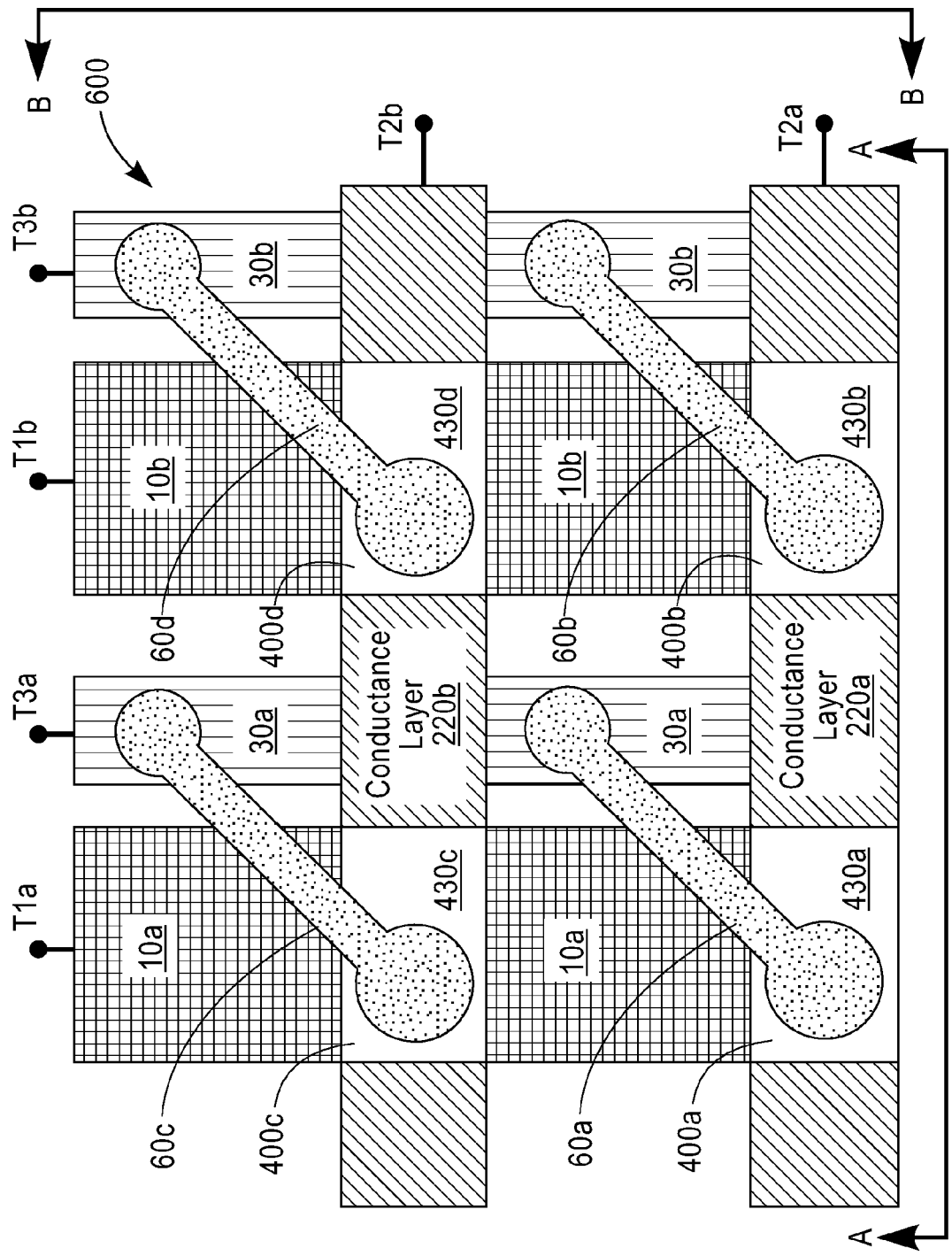
FIG. 4 illustrates a top-down view of a spin-torque based magnetic write random access memory system in an exemplary array.
Figure 5:
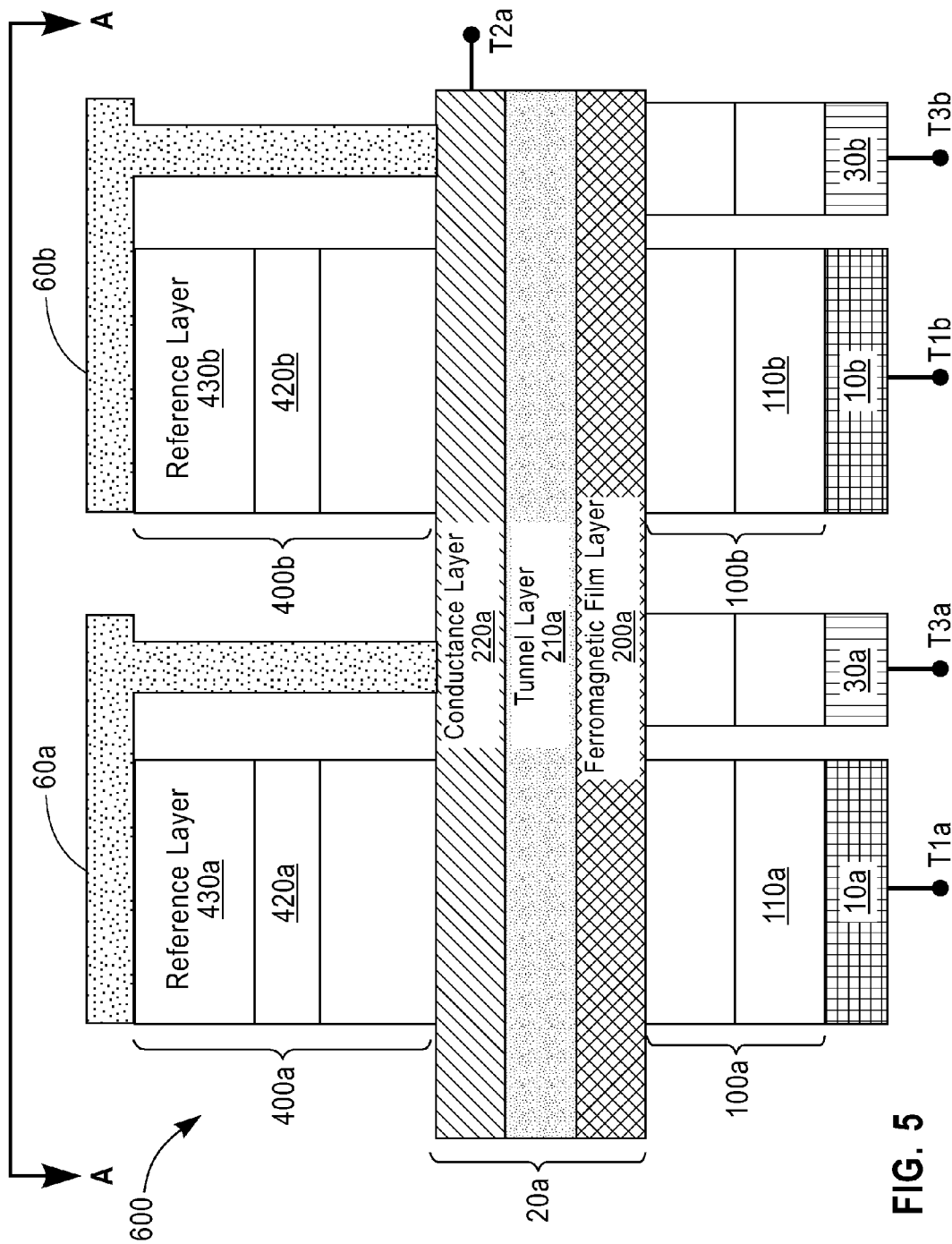
FIG. 5 illustrates a front partially cut-away view of the spin-torque based magnetic write random access memory system in the exemplary array of FIG. 4 along a line A-A.
Figure 6:
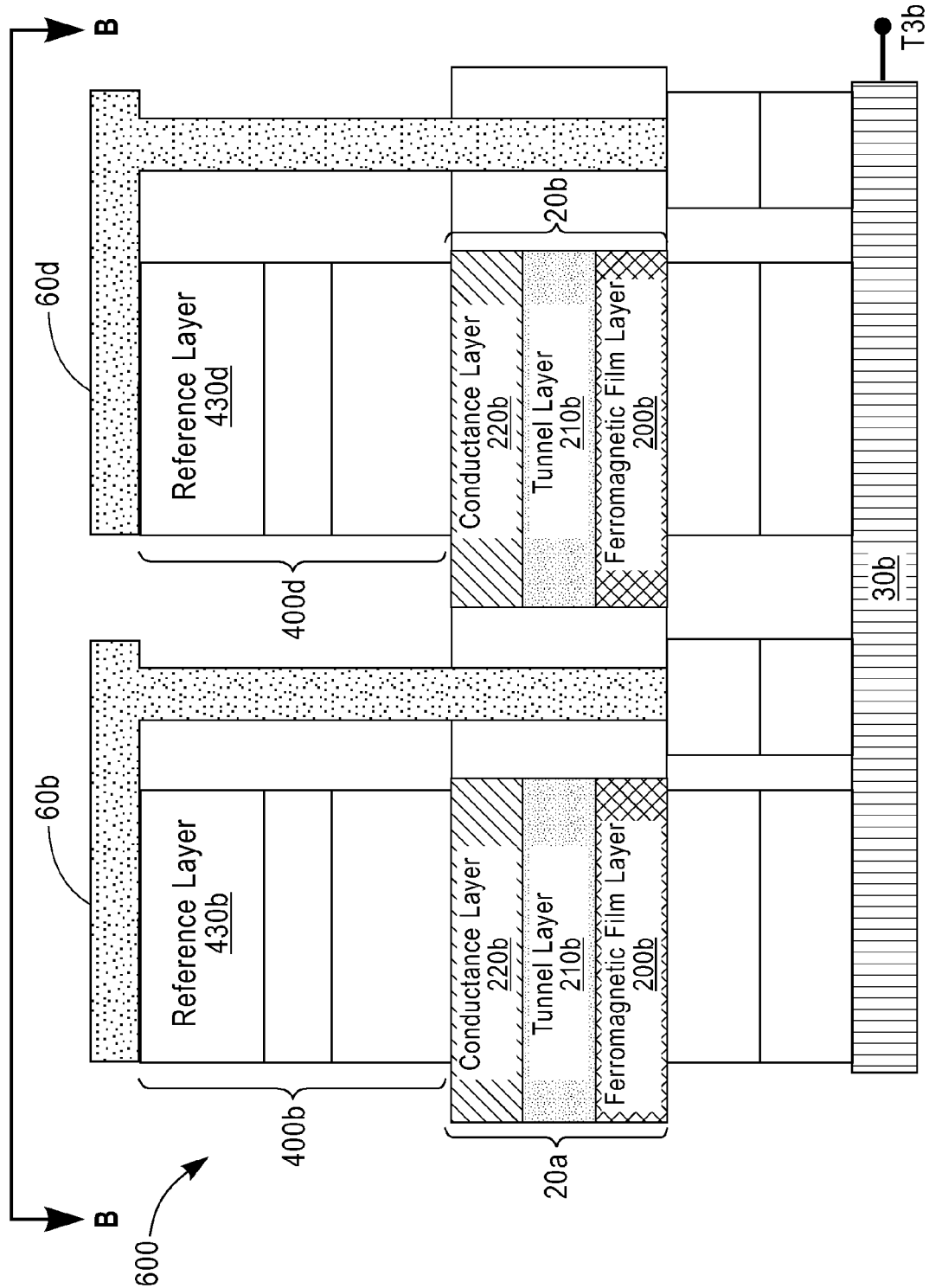
FIG. 6 illustrates a side partially cut-away view of the spin-torque based magnetic write random access memory system in the exemplary array of FIG. 4 along a line B-B.

FIGS. 4-6 illustrate an exemplary embodiment of a spin-torque based magnetic write random access memory system in an array 600. The array 600 may be processed using complementary metal-oxide-semiconductor (CMOS) methods. FIG. 4 is a top-down view of the array 600. The array 600 includes four read portions and write portions similar to the read portion 400 and write portion 100 described above. Reference layers 430a-430d are shown as the upper portions of read portions 400a-400d. The reference layers 430a and 430c are connected to a line 30a via connectors 60a and 60c respectively. The line 30a is connected to a terminal T3a. Likewise, the reference layers 430b and 430d are connected to a line 30b via connectors 60b and 60d respectively. The line 30b is connected to a terminal T3b. The read portions 400a and 400b are disposed on a conductance layer 220a that is connected to a terminal T2a. The read portions 400c and 400d are disposed on a conductance layer 220b that is connected to a terminal T2b. Terminals T1a and T1b are connected to lines 10a and 10b respectively. The line 10a is connected to a doped region 110a and a doped region 110c (not shown) of write portions 100*a* and 100*c* (not shown) respectively. The line 10*b* is connected to a doped region 110*b* and a doped region 110*d* (not shown) of write portions 100*b* and 100*c* (not shown) respectively. Though the illustrated embodiment shows a P/N junction, any suitable non-linear selection device may be used for the write portions 100*a*-100*d*.

FIG. 5 is a partially-cut away front view of the array 600 along the line A-A of FIG. 4. FIG. 5 illustrates a spin-current generating portion 20*a* that includes: the conductance layer 220*a* that is connected to the terminal T2*a*, a tunnel barrier layer 210*a*, and a ferromagnetic film layer 200*a*. The reference layers 430*a* and 430*b* are connected to the connectors 60*a* and 60*b* respectively. The doped region 110*a* and the doped region 110*b* are connected to the lines 10*a* and 10*b*. The connectors 60*a* and 60*b* pass in electrical isolation through the conductance layer 220*a*, the tunnel barrier layer 210*a*, and the ferromagnetic film layer 200*a*, and are connected to the lines 30*a* and 30*b*.

FIG. 6 is a partially-cut away side view of the array 600 along the line B-B of FIG. 4. FIG. 6 illustrates a spin-current generating portion 20*b* that is similar to the spin-current generating portion 20*a*.

In operation, the diode selection for writing to the read portion 400*a*, for example, is accomplished by electrical selections between the terminals T1*a* and T2*a*, where a write current passes. Diode selection for reading the array is accomplished by selecting between lines T2*a* and T3*a*, where the resistance of the read portion 400, if much larger than the dynamic on-state resistance of the diode stack (the write portion 100*a*), may be determined.

If the magnetoresistance of the read portions 400*a*-400*d* is optimized, it may be possible in alternate embodiments to rely on deposited poly-silicon diode for read-out selection also, in which case lines 30*a* and 30*b* and connectors 60*a*-60*d* may be eliminated and the read-selection diode structure be built vertically. Such a configuration would double the density of the memory from what is shown in FIG. 4.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A magnetic random access memory system comprising:
    a spin-current generating portion including:
        a ferromagnetic film layer; and
        a conductance layer;
    a first write portion in electrical contact with the ferromagnetic film including a selection device;
    a first read portion in electrical contact with the conductance layer including:
        a free layer magnet;
        a read non-magnetic layer; and
        a reference layer;
    a second write portion in electrical contact with the ferromagnetic film; and
    a second read portion in electrical contact with the conductance layer.

2. The system of claim 1, further comprising a tunnel barrier layer disposed between the ferromagnetic film layer and the conductance layer.

\* \* \* \* \*